United States Patent

[11] 3,573,806

[72] Inventor Aaron David Klein
Rockville, Md. (4016 Briars Road, Olney, Md. 20832)
[21] Appl. No. 763,861
[22] Filed Sept. 30, 1968
[45] Patented Apr. 6, 1971

[54] NONCONTACT ENCODER INTERPOLATION TECHNIQUE
7 Claims, 6 Drawing Figs.

[52] U.S. Cl. .......... 340/347
[51] Int. Cl. .......... G08c 9/06
[50] Field of Search .......... 340/347

[56] References Cited

UNITED STATES PATENTS 2,866,184 12/1958 Gray .......... 340/347
3,111,660 11/1963 Stupar .......... 340/347
3,141,160 7/1964 Hartke .......... 340/347
3,303,347 2/1967 Wingate .......... 340/347
3,445,841 5/1969 Parkinson .......... 340/347

*Primary Examiner*—Maynard R. Wilbur
*Assistant Examiner*—Jeremiah Glassman
*Attorneys*—E. J. Brower, Arthur L. Branning, T. O. Watson and T. J. Madden

ABSTRACT: This invention is directed to an optical shaft encoder. The encoder utilizes a binary coded disc whose last track is clear. The output of the photodetector associated with this track is compared by appropriate circuitry with the output of two matched detectors each having an area half that of the first detector. This comparison yields a signal which is an angular function of the position of the disc. A decimal to binary converter is utilized to provide a binary representation of the comparison signal.

INVENTOR
AARON DAVID KLEIN

BY [signature]
[signature] ATTORNEYS

NONCONTACT ENCODER INTERPOLATION TECHNIQUE

STATEMENT OF GOVERNMENT INTEREST

The invention defined herein may be manufactured and used by or for the Government of the United States of America for governmental purposes without the payment of any royalties thereon or therefor.

BACKGROUND OF THE INVENTION

1. Field of Invention

This invention is directed to an improved encoding apparatus. More particularly, this invention is directed to an encoding apparatus which increases the angular resolution without increasing the size or number of the discs or drums used.

2. Description of the Prior Art

Shaft encoders, as is well known in the art, convert an analogue input to a digital output where the analogue input is the angular position of a shaft or similar device and the digital output is a binary number. Encoders are generally of three types, contact, magnetic and optical. Referring to an optical encoder in particular, the encoder contains a rotatable disc which has a plurality of tracks. The disc is placed between a source of illumination and a light detector. Each track contains opaque and transparent segments which form a binary code and each track represents one bit of a binary number. The disc is attached to an input shaft and rotates with it. The light detectors, whose output is a function of the light passed by the disc, are connected to give a binary output representative of the angular position of the shaft.

SUMMARY OF THE INVENTION

The resolution of a system utilizing a binary code is limited by the number of bits in the binary number represented. At present the most efficient means of increasing resolution has been to increase the number of tracks on the encoder disc. This method, however, has obvious size limitations. Another method has been to utilize a plurality of interconnected coded discs. This also has size limitations and in addition increases the complexity of design. Under existing technology the number of tracks obtainable on a wheel of fixed diameter is limited and any attempts to increase the number of tracks decreases the accuracy of the encoder. None of the prior art methods has, therefore, significantly increased the resolution of the encoders.

The inventive encoding apparatus represents a significant advance over the prior art. Increased resolution is obtained without increasing the numbers of tracks on the encoder disc. Encoders utilizing the inventive technique have extremely accurate outputs and a greater resolution than has hitherto been known to the art.

The inventive encoder differs from those known in the prior art in that two detectors are provided for the last binary coded track and in that a clear track is engraved on the disc following the last binary coded track. The operation of the encoder with respect to all but the last two tracks is identical with that of the prior art.

With respect to the last two tracks circuitry is provided which sums the output of the detectors associated with the last segmented track and divides this sum by the output of the detector associated with the clear track to obtain a signal which is a function of the angular position of the disc. This signal is then converted to a binary signal.

It is an object of this invention to provide a new and improved technique for increasing the resolution of optical encoders.

It is a further object of this invention to provide an optical encoder having high resolution.

It is a still further object of this invention to provide an optical encoder whose resolution can be increased without increasing the number of tracks on the encoding disc.

It is yet another object of this invention to provide an optical encoder which utilizes electronic circuitry to increase its resolution.

BRIEF DESCRIPTION OF DRAWINGS

Other objects and advantages of the present invention can be appreciated from the following detailed description and FIGS. in which.

DESCRIPTION OF PREFERRED EMBODIMENTS

Figures 1, 2, 4:
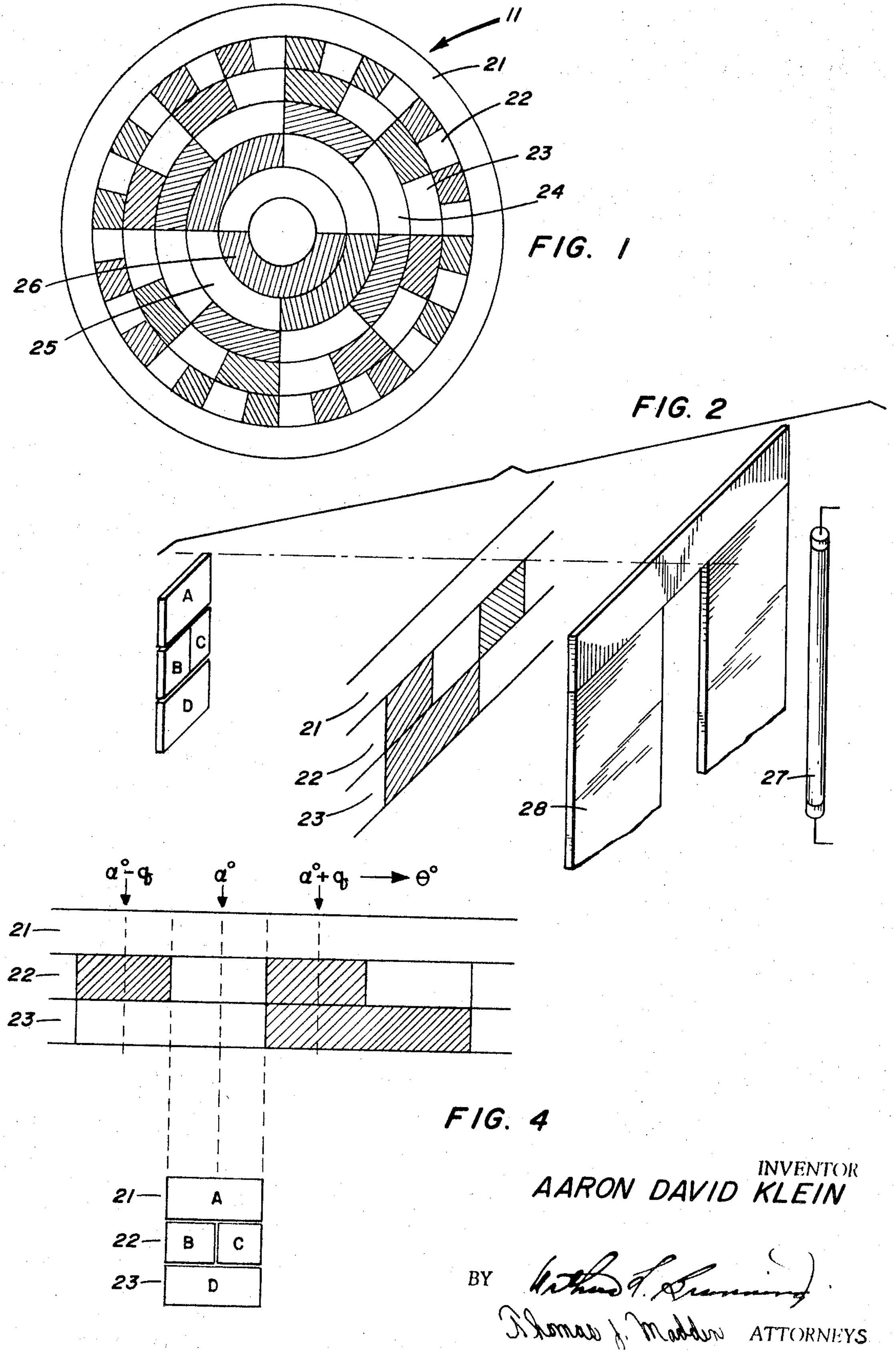
FIG. 1 is a drawing of a disc which is utilized by the inventive encoder.
FIG. 2 is a diagrammatic representation of part of the encoder.
FIG. 4 is a drawing of part of the encoder disc together with the detectors utilized thereby.

Referring to the FIGS., FIG. 1 shows the disc 11 that is used with the inventive encoder. The disc is provided with a plurality of concentric tracks 21 and 26 radially disposed about the center. Each track is of a predetermined radial width and is comprised of transparent (unshaded) and opaque (shaded) segments. The segments and tracks form a binary arrangement in which the number of segments in each successive track outwardly is double the number in the next inward track. Each track represents one bit of a binary number. The disc 11 differs from prior art discs in that the outer track 21 is clear.

FIG. 2 shows a partial diagrammatic representation of the mechanical arrangement of the encoder. Photoelectric detectors A, B, C and D are provided to detect the light passing through the transparent segments of disc 11. The light is provided by lamp 27 through a slit in shield 28. The width of the slit is the same as that of the segments in the last outward track on the disc and the width of the photoelectric detectors is likewise the same. The last outward track represents the least significant bit of the binary number obtainable with the disc and previously has been the limit of the resolution obtainable with encoders.

Figure 5:
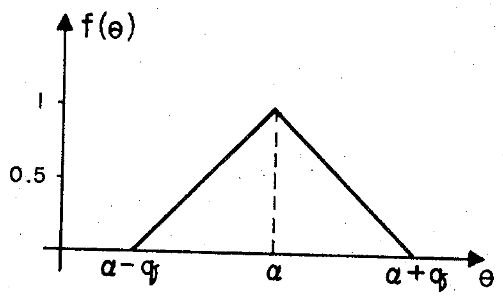
FIG. 5 is a graph showing operation of the detectors associated with the last two tracks.
Figure 6:
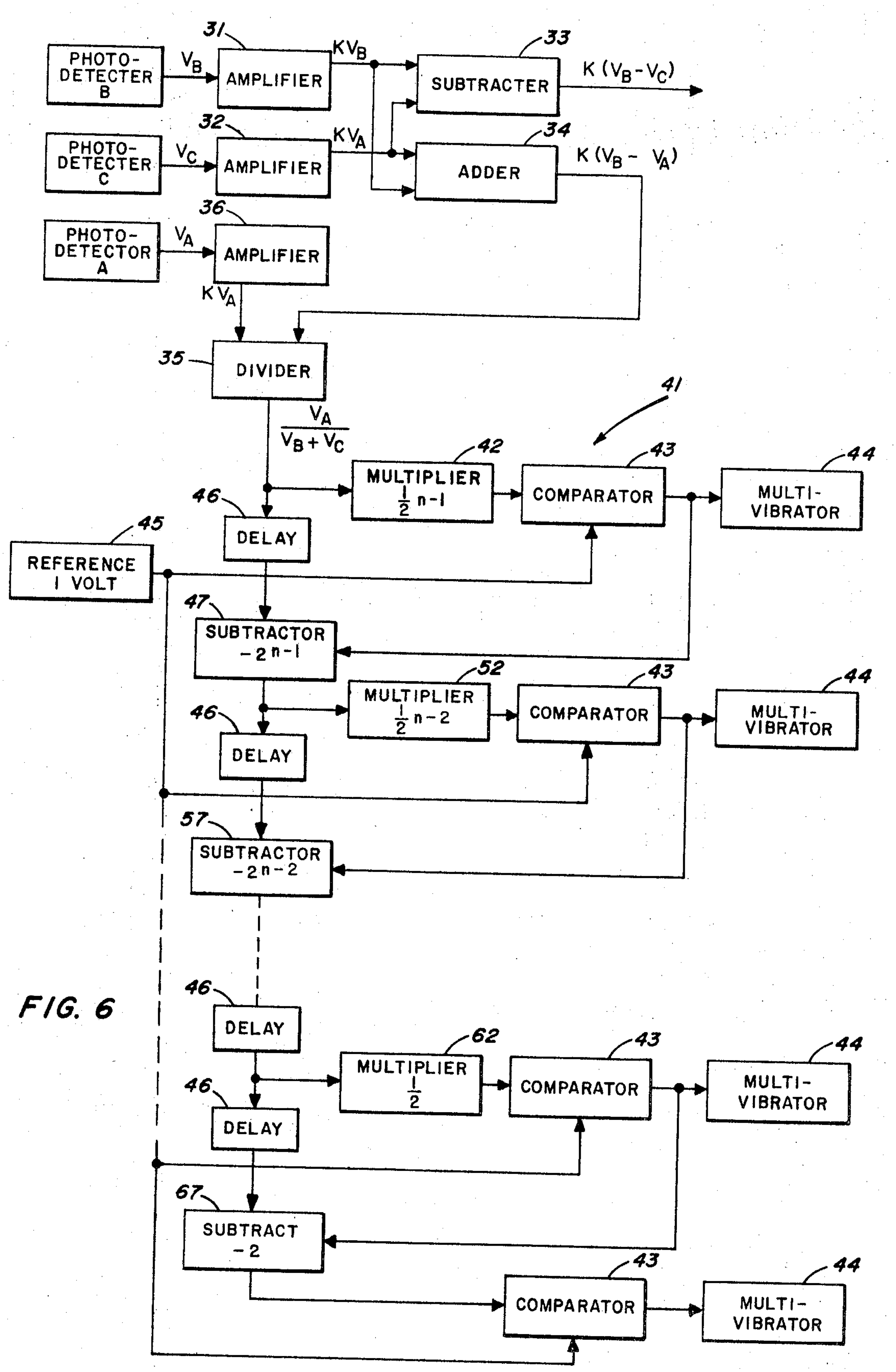
FIG. 6 is a diagram of the electrical circuitry of the inventive analyzer.

FIG. 6 details the electrical circuitry of the inventive encoder. In the first part of the circuitry the outputs of the photoelectric detectors B and C are summed and divided by the output of detector A. The reciprocal of this output is shown in FIG. 5. The second part of the circuitry is a decimal to binary converter which enhances the resolution of the encoder.

Referring more particularly to FIG. 6, the outputs of photodetectors B and C are fed, respectively, to amplifiers 31 and 32. The output of these amplifiers is connected to subtractor 33 and adder 34. The output of the adder is passed to a divider 35 together with the output of photodetector A obtained through amplifier 36. The amplifiers 31, 32 and 36 are identical and the amplification factor drops out in the division process.

The output of the divider is then connected to the digital to binary converter designated generally as 41. The converter has a plurality of stages corresponding to the number of bits desired in the binary output.

The output of the divider is first fed to a multiplier 42, a comparator 43 and a flip-flop or multivibrator 44. The comparator may comprise a Schmitt trigger or similar device having a bias level of 1 volt provided by reference source 45. The output of divider 35 is also fed to a delay circuit 46 and a subtractor 47 provided with a bypass circuit.

A plurality of stages are utilized in which the output of the divider is multiplied by decreasing powers of $1/2^{n11}$ where *n* can range between o and infinity and represents the number of bits in the binary output of converter 41. This operation is shown as performed by multipliers 52 and 62. In each of these stages the output of the divider is also subtracted by decreasing powers of $2^{n11}$ by means of circuits 57 and 67. The comparator 43, multivibrator 44 and delay circuits 46 are identical for each stage. While only 4 stages are shown, it should be understood that any number of stages could be provided.

OPERATION

In operation disc 11 is attached to a shaft or similar device whose angle of rotation $\theta$ is to be determined. The light from source 27 is columnized by the slit in shield 28. The light that passes through the transparent segments of the discs is detected by photoelectric detectors A through C. A single photoelectric detector is provided for all but the last segmented track which has two identical detectors. The outputs of these detectors are fed to individual multivibrators which register a 1 if the detector to which it is connected senses light or a 0 if no light is sensed.

In applying binary notation to angular displacement each track represents a range of degrees. There are 360 possible degrees within which the angle of a shaft might lie. The first track of disc 11 divides this in half. The second track divides the 360° into 4 parts, the third into 8 parts, and so on.

Figure 3:
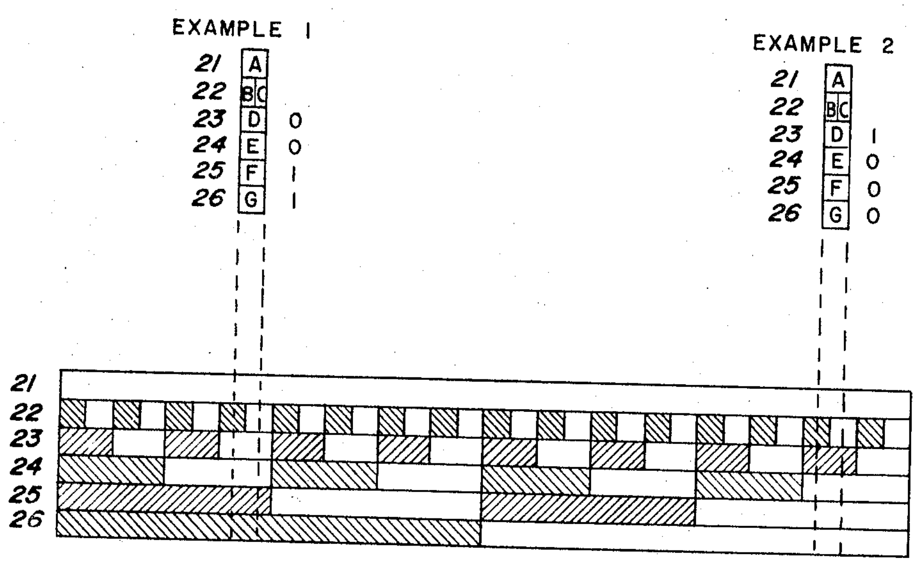
FIG. 3 sets out two examples of the operation of the encoder.

In FIG. 3 the tracks on the disc are shown in linear fashion for purposes of description. The detectors are shown below and adjacent to an angular position of the shaft. The detectors are labeled according to their corresponding tracks. In the first example the output of the first four tracks is 1100. This indicates that the shaft is in the angular range of 67.5° to 99°. In the second example the output of the first four tracks is 0001 and this indicates that the shaft is in the angular range of 315° to 337.5°. Thus it is seen that the encoder at this point can only predict the position of the shaft within 22.5°. Increasing the number of tracks will, of course, decrease the angular range within which the encoder can predict the angle of the shaft increase and this is the method used in the prior art. The resolution of this system, however, is limited by the number of tracks on the disc.

The resolution of the and encoder, however, is not limited by the number of tracks. In the inventive system the last track on the disc is clear and two detectors B and C are used with the last segmented track to increase the resolution. The A, B and C detectors are matched and the surface area of detector A is twice that of detectors B and C.

The output of these photodetectors is a voltage signal. Within limits this voltage output is proportional to the surface area of the detector exposed to light.

Using the example of FIG. 3 the inventive encoder will register a first binary output which indicates that the shaft lies in the angular range between 67.5° and 90°.

Then, as seen in FIGS. 4, 5 and 6, the encoder will yield a second binary signal which indicates the position of the shaft within this angular range.

Referring to FIG. 4, the angle $\alpha$ is that angle which bisects any given transparent segment of the last segmented track where the angular width of each segment is $q$. The angular position of the shaft, $\theta$, for any given segment will therefore equal $\alpha \pm q/2$ or in the example 78.75°±11.25°. When the voltage output of detector B, $V_b$, equals the voltage output of detector $c$, $V_c$, then the angle of the shaft, $\theta$, equals the angle $\alpha$. Likewise, when $V_b$ is greater than $V_c$, then $\theta$ will be greater than $\alpha$ and when $V_c$ is greater than $Vb$, then $\alpha$ will be less than $\alpha$.

Turning now to FIG. 6, the output of detectors B and C are first amplified at 31 and 32 and then added together by adder circuit 34. The output of the adder is divided at 35 by the amplified output of detector A to obtain the signal.

This signal is the reciprocal of $f(\theta)$ represented in FIG. 5. The reciprocal of $f(\theta)$ is used because the circuitry involved in converting a decimal number having a value greater than 1 is not as complex as that involved in converting a decimal number having a value less than 1. It is understood, of course, that an angle can be derived from the reciprocal of $f(\theta)$ as well as $f(\theta)$ itself.

The amplified outputs of photodetectors are also fed to subtractor 33. The output of the subtractor is used to indicate the position of the disc with respect to $\alpha$. Thus, if the output of the subtractor is zero, $V_B$ equals $V_C$ and $\theta$ equals $\alpha$. Similarly, if the output is negative, $V_C$ is greater than $V_B$ and $\theta$ is less than $\alpha$. Thus it is seen that the encoder utilizing the outputs of the divider and the subtractor can predict the exact angle within a given angular range at which the input shaft lies.

A decimal to binary converter 41 is connected to the output of the divider to convert the decimal output of the divider to a binary signal. The counter may have any number of stages. Each of these represents one bit of a binary number having $n$ bits, and the resolution by which the angular signal $\alpha \pm q$ is represented is limited only by the number of stages provided.

In operation, 1 output of the divider is first multiplied at 42 by a factor of $1/2^{n11}$ and then fed to a comparator having a bias level of 1 volt supplied by reference source 45. If the output of the multiplier is less than 1 volt, the comparator yields no output and passes to succeeding levels where it is multiplied by decreasing power of $1/2^{n11}$ until at some point it yields an output of at least 1 volt. (Since the output of the divider can never be less than 1 volt, this point will be reached at some level of the divider). The multivibrator associated with each stage will continue to register a 0 until triggered by its respective comparator. If at any succeeding stage the multiplier yields an output greater than 1, the comparator pulses the multivibrator to record a 1. At the same time, in every stage but the last, the comparator will also pulse a subtractor, such as 47, 57 or 67, to subtract a factor of $2^{n11}$ in decreasing powers of $n$ from the output of the divider. A delay network 46 is provided before each subtractor to allow sufficient time for each comparator to act. The subtractor is provided with a bypass and will pass the input signal without subtraction unless triggered by the comparator.

By way of example, assume that the output of the divider is 65 volts and the number of bits $n$ in the binary number produced by converter 41 is seven. At the first stage 73 will be multiplied by $1/2^6$ or 1/64. Since the output of the multiplier is greater than 1, the comparator will trigger the multivibrator to register a 1 and will also trigger the subtractor which will subtract 64 from the output of the divider 65, leaving a remainder of 1. In each succeeding stage this 1 volt will be multiplied by $1/2^5$, $1/2^4$, $1/2^3$, $1/2^2$ and $1/2^1$, and in each case the multipliers will not trigger their comparators and their associated multivibrators will retain their outputs of 0. In the last stage, the 1 volt signal is effectively multiplied by $1/2^0$ or 1 yielding an output to the comparator of 1. The comparator in this stage will trigger its multivibrator to register 1. The output of the digital to binary converter will be 1000001 which is the binary equivalent of the decimal 65.

The output of the converter is then fed to a recognition circuit which registers the angle of the encoder with respect to $\alpha$.

The inventive encoder is thus seen to provide two outputs which give a highly accurate representation of the angle at which an input shaft lies. The first output defines an angular range at which the shaft is positioned and the second signal through correlation with the output of the subtracting circuit 33 defines the angle in that range at which the shaft is positioned.

It is seen, therefore, that an improved encoding technique and shaft encoder yielding greater accuracy and resolution has been provided.

It is understood, of course, that any number of tracks can be used on the encoder discs and that the coding disc is not limited to binary notation, but any coding system can be used as long as the last track on the disc is clear. Furthermore, while an optical encoder has been described, the principles of this invention are equally applicable to magnetic, infrared, nuclear and similar encoding systems.

I claim:

1. An analogue to digital encoder, comprising:

a disc mounted on a shaft, the angular position of which is to be expressed in digital form;

said disc having a plurality of circumferentially extending tracks;

the outermost track on said disc being completely transparent and the remaining inner tracks on said disc each having transparent and opaque segments, said tracks forming a digital code for representing angular position;

a source of energy mounted adjacent to said disc;

a plurality of detectors mounted on the side of the disc opposite that on which the source of energy is mounted wherein at least one detector is provided for each track with two detectors being provided for the outermost segmented track; and electrical means connected to said detectors for providing a representation of their outputs.

2. An analogue to digital encoder as in claim 1, wherein said electrical means comprises:

first means for giving a representation of the angular position expressed by the tracks on said disc other than said outermost segmented track; and second means for giving an electrical representation of the angular position expressed by said outermost segmented track which represents the smallest angular division in the code formed by the tracks of said disc.

3. An analogue to digital encoder as in claim 2, wherein said second means includes:

an adder circuit to sum the outputs of the two detectors associated with said outermost segmented track which represents the smallest angular division in the code formed by the tracks of said disc; and a divider circuit to receive the output associated with said outermost transparent track and the output of said adder circuit; and said divider circuit being operative to divide the output of said two detectors by the output of said adder circuit.

4. An analogue to digital encoder as in claim 3 wherein said second means further includes a decimal to binary converter connected to the output of said divider circuit.

5. An analogue to digital encoder as in claim 4 wherein said decimal to binary converter has a plurality of stages each of which comprises:

a flip-flop;

a multiplier which multiplies the received signal by decreasing powers of $1/2^{n11}$ a subtractor which subtracts decreasing powers of $2^{n11}$ from the input signal;

a reference signal means;

a comparator which compares the output of said multiplier with a signal from said reference signal means; and said comparator being operative to trigger said flip-flop and said subtractor when the output of said multiplier exceeds the signal from said reference signal means.

6. An analogue to digital encoder as in claim 3 wherein the tracks of said disc utilize a binary coding system.

7. An analogue to digital encoder as in claim 6 wherein the source of energy is a light source and the detectors comprise photoelectric detectors.